US006955974B2

(12) United States Patent
Lee et al.

(10) Patent No.: US 6,955,974 B2
(45) Date of Patent: Oct. 18, 2005

(54) METHOD FOR FORMING ISOLATION LAYER OF SEMICONDUCTOR DEVICE

(75) Inventors: Tae Hyeok Lee, Kyoungki-do (KR); Cheol Hwan Park, Seoul (KR); Dong Su Park, Kyoungki-do (KR); Ho Jin Cho, Kyoungki-do (KR); Eun A Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/877,714

(22) Filed: Jun. 25, 2004

(65) Prior Publication Data

US 2005/0136618 A1 Jun. 23, 2005

(30) Foreign Application Priority Data

Dec. 19, 2003 (KR) ..................... 10-2003-0094099

(51) Int. Cl.[7] ............................................ H01L 21/762
(52) U.S. Cl. ...................... 438/437; 438/763; 438/794
(58) Field of Search ................................ 438/437, 763, 438/794, FOR 227; 257/E21.546

(56) References Cited

U.S. PATENT DOCUMENTS 5,652,176 A * 7/1997 Maniar et al. .............. 438/437
6,140,251 A * 10/2000 Arghavani et al. .......... 438/778
6,156,620 A * 12/2000 Puchner et al. ............. 438/400
6,204,146 B1 * 3/2001 Jenq ........................... 438/424
6,265,302 B1 * 7/2001 Lim et al. ................... 438/622
6,323,106 B1 * 11/2001 Huang et al. ............... 438/433
6,465,350 B1 * 10/2002 Taylor et al. ............... 438/688
6,740,592 B1 * 5/2004 Doong ....................... 438/700
2001/0031540 A1 * 10/2001 Lim et al. ................... 438/424
2002/0177270 A1 * 11/2002 Beyer et al. ................ 438/221
2003/0162366 A1 * 8/2003 Puchner et al. ............. 438/446
2005/0020027 A1 * 1/2005 Lim et al. ................... 438/437
2005/0093103 A1 * 5/2005 Gong et al. ................. 257/622

* cited by examiner

*Primary Examiner*—George Fourson
(74) *Attorney, Agent, or Firm*—Ladas & Parry LLP

(57) ABSTRACT

A method for forming an isolation layer of a semiconductor device, which comprises the steps of: a) sequentially forming a pad oxide layer and a pad nitride layer on a silicon substrate; b) etching the pad nitride layer, the pad oxide layer, and the silicon substrate, thereby forming a trench; c) thermal-oxidizing the resultant substrate to form a sidewall oxide layer on a surface of the trench; d) nitrifying the sidewall oxide layer through the use of $NH_3$ annealing; e) depositing a liner aluminum nitride layer on an entire surface of the silicon substrate inclusive of the nitrated sidewall oxide layer; f) depositing a buried oxide layer on the liner aluminum nitride layer to fill the trench; g) performing a chemical mechanical polishing process with respect to the buried oxide layer; and h) eliminating the pad nitride layer.

6 Claims, 2 Drawing Sheets

METHOD FOR FORMING ISOLATION LAYER OF SEMICONDUCTOR DEVICE

BACKGROUND OF THE INVENTION

1. Field of the Invention

The present invention relates to a method for forming an isolation layer of a semiconductor device, and more particularly to a method for forming an isolation layer of a semiconductor device for preventing increase of a moat depth and occurrence of defects due to formation of a liner nitride layer.

2. Description of the Prior Art

As semiconductor memory devices become more highly integrated, isolation between unit devices is achieved by a shallow trench isolation (hereinafter, referred to as an STI) process which can minimize a bird's beak.

Further, in performing the STI process, technology has been introduced, which forms a liner nitride layer before deposition of an oxide layer buried in a trench in order to solve the reduction of a refresh time due to the miniaturization of devices.

This is because the liner nitride layer prevents a silicon substrate from oxidizing by the following process, thereby improving an STI profile, reducing micro-electrical stress onto a junction portion simultaneously, and finally improving a refresh characteristic. Therefore, the yield and reliability of elements increase.

However, in the prior art, when an isolation layer is formed employing a liner nitride layer, the following problems occur.

Firstly, the liner nitride layer increases the depth of a moat, thereby causing the reduction of a threshold voltage Vt and finally increasing off current.

Secondly, in a burn-in test performed after a D-RAM device is assembled, an interfacial surface between the liner nitride layer on a side surface of the isolation layer and a sidewall oxide layer is excited even under conditions of low electric field and functions as a trapping center of hot electrons acting as a source of leakage current, thereby forming a strong electric field on a PMOS drain region and increasing drain current, that is, off current due to the reduction of a channel length. Therefore, the device is degraded.

This phenomenon is called "hot carrier degradation" and has a bad influence on the reliability of a semiconductor device.

SUMMARY OF THE INVENTION

Accordingly, the present invention has been made to solve the above-mentioned problems occurring in the prior art, and it is an object of the present invention to provide a method for forming isolation layer of a semiconductor device, which can prevent the increase of moat depth and the occurrence of defects due to formation of a liner nitride layer.

Another object of the present invention is to provide a method for forming isolation layer of a semiconductor device, which prevents the increase of a moat depth and the occurrence of defects due to formation of a liner nitride layer, thereby improving the reliability and properties of the device.

In order to achieve the above objects, according to one aspect of the present invention, there is provided a method for forming an isolation layer of a semiconductor device, the method comprising the steps of: a) sequentially forming a pad oxide layer and a pad nitride layer on a silicon substrate; b) etching the pad nitride layer, the pad oxide layer, and the silicon substrate, thereby forming a trench; c) thermal-oxidizing the resultant substrate to form a sidewall oxide layer on a surface of the trench; d) nitrifying the sidewall oxide layer through the use of $NH_3$ annealing; e) depositing a liner aluminum nitride layer on an entire surface of the silicon substrate inclusive of the nitrated sidewall oxide layer; f) depositing a buried oxide layer on the liner aluminum nitride layer to fill the trench; g) performing a chemical mechanical polishing process with respect to the buried oxide layer; and h) eliminating the pad nitride layer.

In the present invention, the $NH_3$ annealing step is carried out at temperature of 600 to 900° C. with pressure of 5 mTorr to 200 Torr through a plasma annealing process or a thermal annealing process.

In the present invention, steps d and e are carried out in-situ.

In the present invention, in step e, the liner aluminum nitride layer is deposited using an organic compound containing Al as source gas of the Al and using $NH_3$ or $N_2$ as source gas of nitrogen under conditions of temperature of 200 to 900° C. and pressure of 0.1 to 10 Torr according to an LPCVD or ALD method.

In the present invention, step e includes sub-steps of depositing a aluminum layer through an LPCVD or ALD method and annealing the aluminum layer by using $NH_3$ or $N_2$ gas.

In the present invention, the annealing step is performed by one of a plasma annealing process, a rapid thermal process, and a furnace annealing process.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Hereinafter, a technical principle of the present invention will be described.

In the present invention, the conventional liner nitride layer is replaced with (by) an aluminum nitride layer AlN which has superior oxidation resistance/abrasion resistance in comparison with a silicon nitride layer $Si_3N_4$ and has a thermal expansion coefficient similar to that of silicon. Also, before a liner aluminum nitride layer is deposited, $NH_3$ annealing is carried out to nitrify a sidewall oxide layer.

In this way, a refresh characteristic improving effect of the liner nitride layer can be further increased through low thermal stress. Also, the sidewall oxide layer becomes an oxynitride layer, so that the loss of an isolation layer edge (STI edge) due to etchant can be minimized in the following pad nitride layer removal process. Therefore, moat depth can be reduced. In addition, Si dangling bond on an interfacial surface between the sidewall oxide layer and the aluminum nitride layer is subjected to passivation by means of hydrogen in the $NH_3$ annealing, so that the Si dangling bond does not function as a trapping center.

Consequently, in the present invention, an aluminum nitride layer is formed instead of a silicon nitride layer and $NH_3$ annealing is carried out before the aluminum nitride layer is formed, thereby decreasing moat depth and increasing a cell threshold voltage Vt. Further, stress due to an isolation layer is reduced, thereby improving a refresh characteristic. Furthermore, the trapping of electrons and isolation of Boron are prevented, thereby preventing the increase of electric field and off current due to hot electrons in a PMOS drain region to which strong electric field is applied. Therefore, the deterioration of a device due to the isolation layer can be prevented.

FIGS. 1*a* to 1*d* are sectional views according to steps in an isolation layer formation method according to the present invention. Hereinafter, the isolation layer formation method will be described in more detail with reference to FIGS. 1*a* to 1*d*.

Figure 1A:
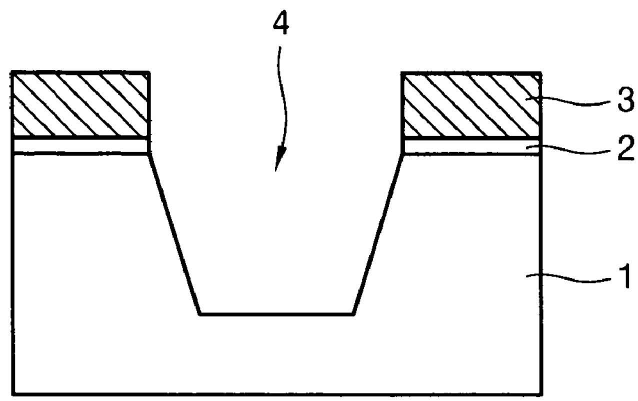
FIGS. 1*a* to 1*d* are sectional views according to steps in a method for forming isolation layer of a semiconductor device according to the present invention.

Referring to FIG. 1*a*, a pad oxide layer 2 and a pad nitride layer 3 are sequentially formed on a silicon substrate 1. Next, a photoresist layer pattern, isolating a device isolation region, on the pad nitride layer 3 according to a well-known photolithography process, and the pad nitride layer 3 is etched using such a photoresist layer pattern as an etching mask.

Subsequently, the pad oxide layer 2 and the silicon substrate 1 are sequentially etched using the etched pad nitride layer 3 as an etching mask, so that a trench 4 is formed. Next, the remaining photoresist layer pattern is eliminated. Herein, the photoresist layer pattern may be eliminated before a trench etching.

Figure 1B:
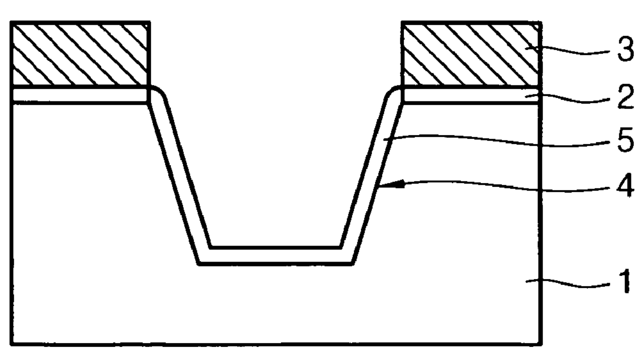

Referring to FIG. 1*b*, in order to recover etching damage in a substrate trench etching, the resultant substrate is subjected to a thermal oxidation process, so that a thin sidewall oxide layer 5 is formed on a surface of the trench 4.

Figure 1C:
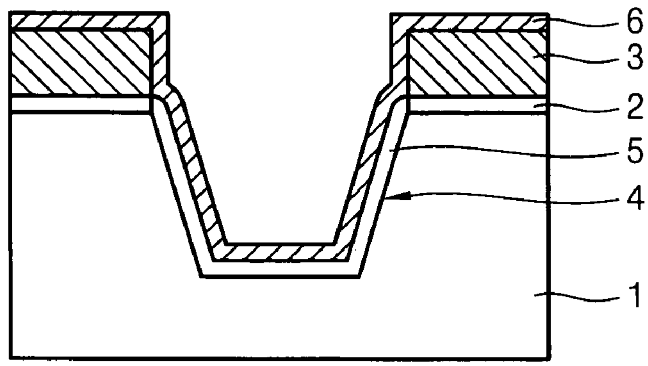

Referring to FIG. 1*c*, the resultant substrate is subjected to $NH_3$ annealing and the sidewall oxide layer 5 is nitrified. Herein, the $NH_3$ annealing is carried out at temperature of 600 to 900° C. with pressure of 5 mTorr to 200 Torr through plasma annealing or thermal annealing.

Next, a liner aluminum nitride layer AlN 6 is deposited on an entire surface of the substrate 1 inclusive of the nitrified sidewall oxide layer 5. Herein, the liner aluminum nitride layer 6 can be obtained by nitrifying the sidewall oxide layer 5 through performing the $NH_3$ annealing with in-situ, in-chamber, and cluster manners. Further, the liner aluminum nitride layer 6 is deposited using an organic compound containing Al, such as TMA, as source gas of the Al and using $NH_3$ or $N_2$ as source gas of nitrogen under conditions of temperature of 200 to 900° C. and pressure of 0.1 to 10 Torr according to an LPCVD or ALD method. According to another method of forming the liner aluminum nitride layer 6, an aluminum layer is deposited through an LPCVD or ALD method and the aluminum layer is subjected to annealing under $NH_3$ or $N_2$ atmosphere, thereby depositing the liner aluminum nitride layer 6. Herein, the annealing may be performed by one of plasma annealing, rapid thermal process (RTP), and furnace annealing.

Figure 1D:
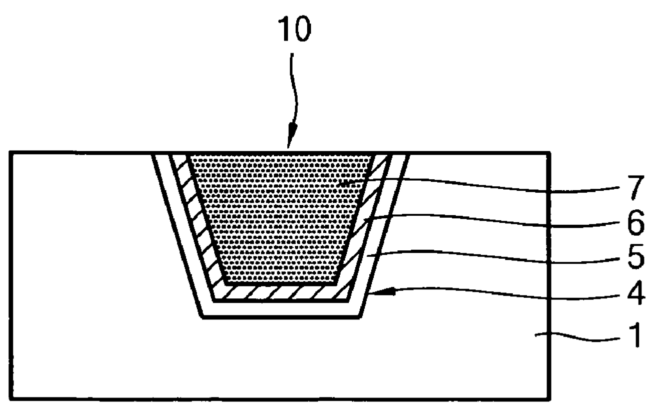

Referring to FIG. 1*d*, a buried oxide layer 7, such as an HDP-oxide layer, is deposited on an entire surface of the substrate 1 to fill the trench 4 on the liner aluminum nitride layer 6. Next, the buried oxide layer 7 and the liner aluminum nitride layer 6 are subjected to chemical mechanical polishing (CMP) to expose the pad nitride layer 3. Subsequently, the pad nitride layer 3 is eliminated through a wet etching using phosphorus solution, thereby forming a trench-type isolation layer 10 according to the present invention.

Herein, in the present invention, a liner nitride layer is replaced with the liner aluminum nitride layer 6 and the sidewall oxide layer 5 is nitrified through $NH_3$ annealing before the liner aluminum nitride layer 6 is deposited, thereby minimizing edge loss of the isolation layer 10 due to etchant, that is, phosphorus, in eliminating the pad nitride layer 3. Therefore, not only moat depth can be reduced but also a cell threshold voltage Vt can increase, so that stress due to the isolation layer 10 can be reduced. Accordingly, refresh characteristic can be Improved.

In addition, in the present invention, the aluminum nitride layer 6 is formed instead of a liner nitride layer and simultaneously $NH_3$ annealing is carried out, so that an interfacial surface between the sidewall oxide layer 5 and the liner aluminum nitride layer 6 does not function as a trapping center. Therefore, the trapping of electrons and isolation of Boron are prevented, thereby preventing the increase of electric field and off current due to hot electrons in a PMOS drain region to which strong electric field is applied. Accordingly, the deterioration of a device due to the isolation layer 10 can be prevented.

Meanwhile, in the prior art, a liner nitride layer is formed and then a liner oxide layer is deposited before a buried oxide layer is deposited. In contrast, in the aforementioned embodiment of the present invention, since the liner aluminum nitride layer 6 has not only very small thermal stress with silicon but also large abrasion resistance against a dry etching, a process for depositing the liner oxide layer can be omitted.

According to the present invention as described above, in order to improve refresh characteristic, an aluminum nitride layer is formed instead of a silicon nitride layer and $NH_3$ annealing is carried out before the aluminum nitride layer is formed to nitrate a sidewall oxide layer, thereby reducing moat depth and thus increasing a threshold voltage. Further, an electron trapping center is eliminated, thereby improving refresh characteristic. Furthermore, since the formation of a liner nitride layer can be omitted, the manufacturing process can be simplified.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A method for forming an isolation layer of a semiconductor device, the method comprising the steps of:

a) sequentially forming a pad oxide layer and a pad nitride layer on a silicon substrate;

b) etching the pad nitride layer, the pad oxide layer, and the silicon substrate, thereby forming a trench;

c) thermal-oxidizing the resultant substrate to form a sidewall oxide layer on a surface of the trench;

d) nitrifying the sidewall oxide layer through the use of $NH_3$ annealing;

e) depositing a liner aluminum nitride layer on an entire surface of the silicon substrate inclusive of the nitrated sidewall oxide layer;

f) depositing a buried oxide layer on the liner aluminum nitride layer to fill the trench;

g) performing a chemical mechanical polishing process with respect to the buried oxide layer; and h) eliminating the pad nitride layer.

2. The method for forming an isolation layer of a semiconductor device as claimed in claim 1, wherein the $NH_3$ annealing step is carried out at temperature of 600 to 900° C. with pressure of 5 mTorr to 200 Torr through a plasma annealing process or a thermal annealing process.

3. The method for forming an isolation layer of a semiconductor device as claimed in claim 1, steps d and e are carried out in-situ.

4. The method for forming an isolation layer of a semiconductor device as claimed in claim 1, in step e, the liner aluminum nitride layer is deposited using an organic compound containing Al as source gas of the Al and using $NH_3$ or $N_2$ as source gas of nitrogen under conditions of temperature of 200 to 900° C. and pressure of 0.1 to 10 Torr according to an LPCVD or ALD method.

5. The method for forming an isolation layer of a semiconductor device as claimed in claim 1, wherein step e includes sub-steps of depositing a aluminum layer through an LPCVD or ALD method and annealing the aluminum layer by using $NH_3$ or $N_2$ gas.

6. The method for forming an isolation layer of a semiconductor device as claimed in claim 5, wherein the annealing step is performed by one of a plasma annealing process, a rapid thermal process, and a furnace annealing process.

* * * * *